(12) United States Patent
Trimmer

(10) Patent No.: US 12,117,487 B2
(45) Date of Patent: Oct. 15, 2024

(54) PROTECTION OF THE CONTENT OF A FUSE MEMORY

(71) Applicant: STMicroelectronics (Grenoble 2) SAS, Grenoble (FR)

(72) Inventor: Mark Trimmer, Coublevie (FR)

(73) Assignee: STMicroelectronics (Grenoble 2) SAS, Grenoble (FR)

(*) Notice: Subject to any disclaimer, the term of this patent is extended or adjusted under 35 U.S.C. 154(b) by 402 days.

(21) Appl. No.: 17/654,918

(22) Filed: Mar. 15, 2022

(65) Prior Publication Data

US 2022/0301649 A1 Sep. 22, 2022

(30) Foreign Application Priority Data

Mar. 18, 2021 (FR) ...................................... 2102717

(51) Int. Cl.
| | |
|---|---|
| G06F 12/14 | (2006.01) |
| G01R 31/317 | (2006.01) |
| G01R 31/3185 | (2006.01) |
| G11C 29/10 | (2006.01) |
| G06F 1/24 | (2006.01) |
| G06F 9/448 | (2018.01) |
| G11C 29/02 | (2006.01) |
| G11C 29/12 | (2006.01) |
| G11C 29/50 | (2006.01) |
| G11C 29/52 | (2006.01) |
| G11C 29/54 | (2006.01) |

(52) U.S. Cl.
CPC ............. *G01R 31/31719* (2013.01); *G01R 31/318588* (2013.01); *G06F 12/1458* (2013.01); *G11C 29/10* (2013.01)

(58) Field of Classification Search
CPC .................................................. G06F 12/1458
USPC ............................................................ 711/163
See application file for complete search history.

(56) References Cited

U.S. PATENT DOCUMENTS

| | | | |
|---|---|---|---|
| 2003/0182080 A1* | 9/2003 | Greenlaw | H03K 21/00 |
| | | | 702/178 |
| 2005/0289355 A1 | 12/2005 | Kitariev et al. | |
| 2012/0278630 A1 | 11/2012 | Little et al. | |
| 2014/0189365 A1* | 7/2014 | Cox | G06F 21/72 |
| | | | 713/189 |
| 2017/0180131 A1* | 6/2017 | Ghosh | G06F 21/75 |
| 2019/0163909 A1* | 5/2019 | Schilder | H04L 9/0822 |
| 2022/0318405 A1* | 10/2022 | Chen | G06F 21/604 |

FOREIGN PATENT DOCUMENTS

CN 101620656 A 1/2010

\* cited by examiner

*Primary Examiner* — Prasith Thammavong
*Assistant Examiner* — Sidney Li
(74) *Attorney, Agent, or Firm* — Slater Matsil, LLP

(57) ABSTRACT

The present disclosure relates to a method wherein a state of an integrated circuit between a first state (e.g., CLOSED), allowing a reading access to the first area of fuse-type non-volatile memory by a processor, and a second state (e.g., OPEN), forbidding the reading access to the memory to the processor, is conditioned to a verification, by a finite state machine, of values of a first fuse word of the memory, representative of a number of transitions to the first state and of a second fuse word of the memory, representative of a number of transitions to the second state.

25 Claims, 4 Drawing Sheets

PROTECTION OF THE CONTENT OF A FUSE MEMORY

CROSS-REFERENCE TO RELATED APPLICATIONS

This application claims the priority to French Patent Application No. 2102717, filed on Mar. 18, 2021, which application is hereby incorporated by reference herein in its entirety.

TECHNICAL FIELD

The present disclosure generally relates to electronic circuits and, in particular embodiments, to integrated circuits having a fuse-type non-volatile memory and testing the integrated circuits.

BACKGROUND

Integrated circuits are used in the design of electronic devices having various applications. Be it in production or during the product's lifetime, integrated circuits are tested for manufacturing defects. Generally, the tests require access to the integrated circuit and use a standardized protocol, known as Joint Test Action Group (JTAG), via a dedicated port of the integrated circuit.

The JTAG interface is currently used to test memories, particularly non-volatile memories. It is likely to be used in production and during the product lifetime, particularly during maintenance operations, to identify possible defects originating from the manufacturing. The integrated circuit is then generally returned to the manufacturer.

In particular, customers may wish to return the product to the manufacturer to be re-tested for manufacturing defects. The customer does not run these tests as part of some routine maintenance operation. The customer sees a problem, suspects it might be a manufacturing defect, and returns the product so that the manufacturer can re-run the scan test to analyze the defect.

Test procedures and access to the information contained in the memories of an integrated circuit are capable of raising an issue in applications where these memories contain information supposed to be hidden from the manufacturer. This may concern authentication or cipher keys (more generally passwords, codes or keys used during the circuit lifetime), software codes or proprietary protocols stored in the circuit during a customization phase carried out by the final user of the circuit or by an intermediate entity between the manufacturer and this user. These elements form information to be hidden from the manufacturer (secrets), which should generally not be communicated to the integrated circuit manufacturer.

In the case where the non-volatile memories of the circuit are of erasable or reprogrammable type (flash memory or EPROM), it is possible to erase areas of the memory containing the "secret" before it is returned for defect analysis. However, when the non-volatile memories are of fuse type, their programming is irreversible, it is then problematic to leave access to the circuit via its JTAG interface during execution of tests of operation of the circuit components.

SUMMARY

There is a need to improve the security and the efficiency of methods of testing devices with integrated circuits containing irreversibly-programmable non-volatile memories. Embodiments of this disclosure overcome all or part of the disadvantages of known devices with integrated circuits.

One embodiment provides a method wherein a state of an integrated circuit between a first state, allowing reading access to the first area of fuse-type non-volatile memory by a processor, and a second state, forbidding the reading access to the memory to the processor, is conditioned to a verification, by a finite state machine, of values of a first fuse word of the memory, representative of a number of transitions to the first state and a second fuse word of the memory, representative of a number of transitions to the second state.

One embodiment provides an integrated circuit comprising a finite state machine conditioning a state of the integrating circuit between a first state, allowing reading access to the first area of a fuse-type non-volatile memory by a processor, and a second state, forbidding the reading access to the memory to the processor, to verification of values of a first fuse word of the memory, representative of a number of transitions to the first state and a second fuse word of the memory, representative of a number of transitions to the second state.

According to an embodiment, the verification consists in comparing the respective values of the first and second words and in checking the value of the maximum significant bit of the first word.

According to an embodiment, the circuit is in the first state if the value of the second word is lower than the value of the first word or if the maximum significant bit of the first word is blown.

According to an embodiment, the verification is performed at each reset of the integrated circuit.

According to an embodiment, in the first state, a scan test of the integrated circuit is forbidden.

According to an embodiment, in the second state, a scan test is enabled for the integrated circuit except for the fuse-type non-volatile memory.

According to an embodiment: each transition of the integrated circuit to the first state is preceded by an incrementation of a first counter defined by the first word of the memory; each transition of the integrated circuit to the second state is preceded by an incrementation of a second counter defined by the second word of the memory.

According to an embodiment, an incrementation of the second counter is exclusively caused by the state machine.

According to an embodiment, an incrementation of the first counter is accessible to the processor.

According to an embodiment, a transition of the circuit from the first state to the second state is performed if and only if, emerging from reset, a value, entered into a register from the outside of the circuit while the circuit is in reset, corresponds to a code stored in the first area of the fuse-type non-volatile memory, the code being only readable by the finite state machine.

According to an embodiment, any introduction of value in the register, while the integrated circuit is in the first state while emerging from reset, increments a third counter defined by a third word of the memory provided that the maximum significant bit of this third word is different than 1.

According to an embodiment, after emerging from the reset, the circuit is in the second state if the value of the third counter is greater than the value of the second counter, the most significant fuse-bit of the first fuse-word is in a programmed state, or the most significant fuse-bit of the third fuse-word is in a programmed state.

According to an embodiment, the circuit is in the first state if the value of the first counter is smaller than or equal to the value of the second counter and the most significant bits of the third and first fuse words are in a non-programmed state.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described to one of the embodiments may also apply to other embodiments. Further, it should be understood that various changes, substitutions, and alterations can be made herein without departing from the spirit and scope of this disclosure as defined by the appended claims.

Like features have been designated by like references in the various figures. In particular, the structural or functional features that are common among the various embodiments may have the same references and may dispose of identical structural, dimensional, and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front," "back," "top," "bottom," "left," "right," etc., or to relative positional qualifiers, such as the terms "above," "below," "upper," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10% and preferably within 5%.

Figure 1:
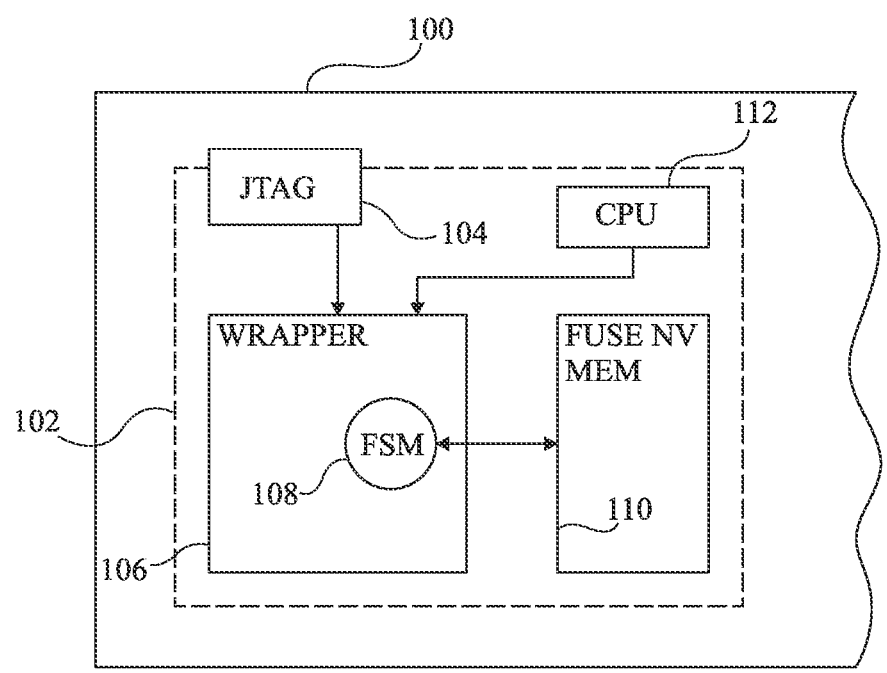
FIG. 1 is a schematic of an embodiment integrated circuit device.

FIG. 1 schematically shows in the form of blocks an embodiment of an electronic device 100 comprising an integrated circuit 102 of the type to which described embodiments apply as an example.

The electronic device is, for example, an electronic board such as a microcircuit card, computer hardware, a microprocessor circuit, etc.

In the applications targeted by the present disclosure, integrated circuit 102 comprises a fuse-type non-rewritable non-volatile memory (FUSE NV MEM) no. By default, at the manufacturing output, all the fuse-type bits of memory no are in the same state, arbitrarily 0. According to the native state of the fuse bits, this state corresponds to a non-conductive or "off" state of the storage elements defining the bits. During the customization of electronic device 100, preceding its acquisition by a final user, data are stored on non-volatile memory no by switching the states of (by blowing) certain bits of the memory (of memory words) to the inverse state 1, for example, corresponding to a conductive or "on" state of the corresponding storage elements.

The "0" or "1" designation of the respective non-conductive and conductive states of the memory bits is arbitrary, and another convention, for example, the inverse: 0 for conductive and 1 for non-conductive, may be taken according to the application.

Among the data stored in memory no, some do not have a specific sensitivity in terms of confidentiality, while others are considered as being secret data that must not come out of the circuit once they have been introduced into it. The integrated circuit, 102, further comprises a processor (CPU) 112, which can access memory no via a wrapper (WRAPPER) 106. Integrated circuit 102 further comprises a JTAG (Joint Test Action Group) access port 104 enabling a user to connect a JTAG-type interface (not shown) to the circuit to request the execution of tests of the system. These tests are, for example, circuit continuity tests detecting possible short-circuits or tests of the circuit's logic functions. Scan testing may be performed on the design of prototypes, during manufacturing, or when device 100 is returned to the manufacturer for defect analysis.

However, access to the "secret" (i.e., confidential data) should not be possible via the test interface. For this purpose, at a step of (the end of) the manufacturing or customization of a circuit, before secret information from the manufacturer is introduced into the circuit, the circuit is "closed," which corresponds to a state where execution of scan-tests is impossible.

However, forbidding any test of the circuit once it is in use also forbids the manufacturer to analyze defects likely to originate from the manufacturing.

The described embodiments provide a new mechanism for authorizing access to the integrated circuit during tests without adversely affecting the security of the data.

For this purpose, the possibility of "opening" the circuit, that is, of allowing JTAG access port 104 to launch scan-tests while protecting the access to the "secret" is provided.

Thus, it is provided for the circuit to have, particularly from the point of view of JTAG port 104, a "closed" state where scan-test is blocked. Still, the wrapper (WRAPPER) 106 allows the processor 112 to access memory no, including its protected part (202, FIG. 2) containing the "secret" and an "open" state where scan-test is permitted. Still, wrapper 106 forbids any access to the protected part 202 of memory no by processor 112 and even via scan.

For this purpose, the described embodiments provide the presence of a finite state machine (FSM) 108 to control the transition from the "closed" state of the circuit to the "open" state. Moreover, wrapper 106, contained in circuit 102, ensures compatibility between data capable of being input via the JTAG interface and the data stored in non-rewritable non-volatile memory no. Wrapper 106 contains finite state machine 108 and is coupled to access port 104 and non-volatile memory no. In this embodiment, JTAG access port 104 is not coupled to processor 112, and, in particular, the respective operations of processor 112 and finite state machine 108 are independent of each other.

Figure 2:
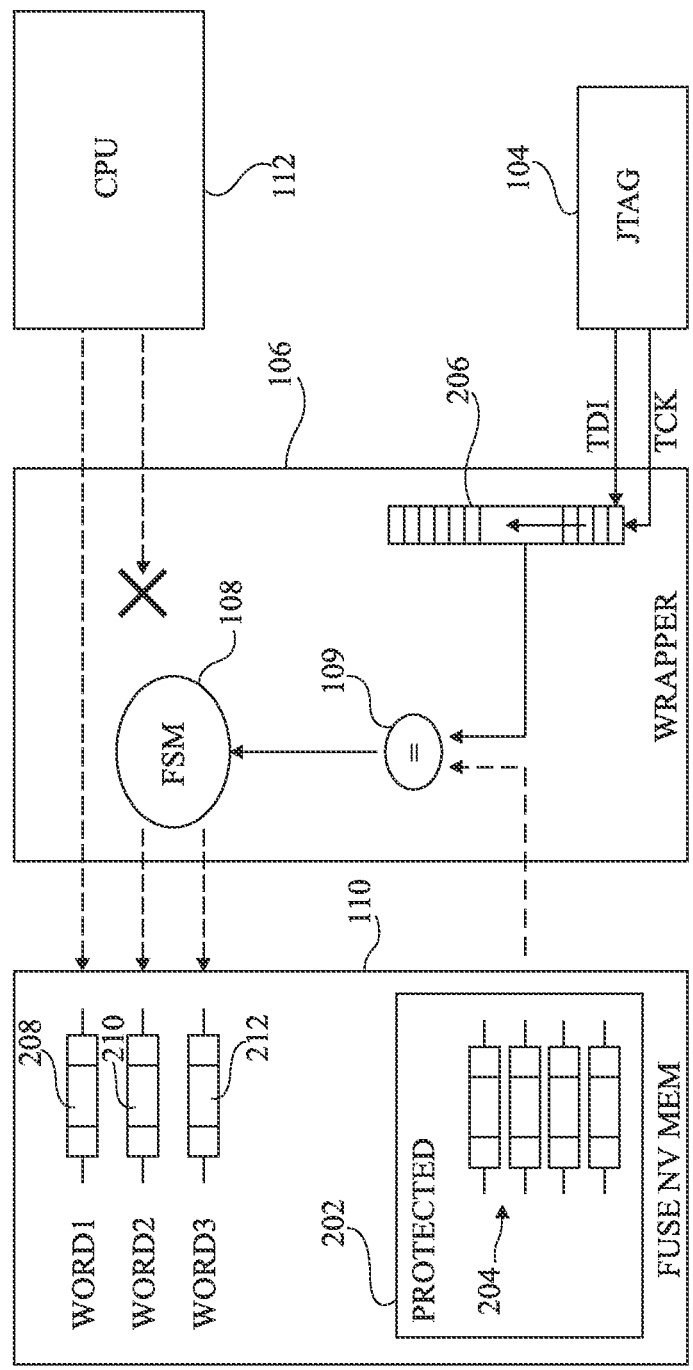
FIG. 2 is a schematic of an embodiment of an integrated circuit.

FIG. 2 schematically shows in the form of blocks, more detailed than in FIG. 1, an embodiment of an integrated circuit of the type to which described embodiments apply as an example.

According to the described embodiments, it is provided for fuse-type non-volatile memory no to comprise or to break down into a plurality of distinct memory areas.

A first area (PROTECTED) 202, containing protected data, contains all the data (program or actual data), the access to which should be reserved to an operation in a secure mode or environment when the circuit is in the closed state. The data is stored by the final user of the circuit or by an intermediate entity between the manufacturer and this user. This data can be authentication or cipher keys, software codes or proprietary protocols, etc. Among the data, codes or passwords are contained in dedicated memory words 204. This or these codes are particularly used to condition the re-opening of the circuit.

Code 204 is only readable by wrapper 106 and, more particularly, by state machine 108. Code 204 may be stored in area 202 by the manufacturer on the production of circuit 102 but is preferably selected and stored during the customization phase. Code 204 corresponds to a fused secret password that, once programmed (or locked), can only be accessed by the finite state machine 108.

At each booting of the circuit, state machine 108 determines whether the chip is in an "open" state or a "closed" state. If the chip is in a "closed" state, and if content has been entered into a register 206 of wrapper 106 before the chip emerges from a reset, the finite state machine compares code 204 with this content. During the time where the chip is in reset, JTAG port 104 is functional, and content can be entered and then stored into register 206.

Register 206, accessible via JTAG port 104, is typically a shift register (volatile shifting) written into via the JTAG portion and read from state machine 108. The writing into the register is usually performed via a data input TDI by being sequenced by a signal TCK originating from the JTAG interface. Function 109 of comparison between the data input via port 104 and those contained in code 204 also forms part of the finite state machine.

Conditioning the opening of the circuit to the input, via the JTAG interface, to data corresponding to a code 204 stored during the customization and the closing of the circuit takes part in preserving the data that the user does not wish to make accessible to the manufacturer. Code 204 can only be read and handled by finite state machine 108 and never by processor 112.

In practice, there are few needs for testing via the JTAG interface during the lifetime of the product (after the customization). Most often, this only occurs once or twice (at most some ten times) along the product lifetime. It is provided to take advantage of this limited need to limit the possible number of circuit opening attempts. Limiting the possible number of openings attempts avoids the risk of hacking by multiple code attempts via the JTAG interface.

For this purpose, a second area containing memory words 208 (WORD1), 210 (WORD2), and 212 (WORDS) having specific functions linked to the opening and to the closing of the circuit is provided in memory 110. More particularly, each word 208, 210, 212 forms a counter, respectively, to the number of closings, the number of openings, and the number of data inputs via port 104 while the chip is in reset. Initially, all the fuse-type bits of words 208, 210, and 212 are in the same state, arbitrarily 0. Word 210 can only be blown by the finite state machine (and not by unit 112).

The length of words 208, 210, and 212 may be the same or may differ from one word to the other. According to the word, this length conditions the number of closings, openings, and password input attempts via the JTAG interface. Preferably, each word 208, 210, 212 comprises at least 8 bits, preferably 32 bits. Since the bits of words 208 to 212 are irreversibly-programmable bits, the corresponding counter does not count a number capable of reaching 2 raised to the power of the number of bits, but a number capable of reaching at most the number of bits.

For simplification, reference will be made hereafter to blowing one bit of a fuse word 208, 210, 212 per operation. It should, however, be noted that in practice, for reliability reasons, it will be preferred to blow the bits per groups of a plurality of bits of the same word, for example, four bits, at each programming. This enables to mare reliable the taking into account of the count provided by the corresponding counter. In read mode, it is then considered that it is sufficient for a single one of the bits of a group to be at state 1 for the change of value to be taken into account. Thus, taking the example of a 32-bits word, the corresponding counter may take 8 values.

Each time, during a booting of a closed circuit, if data have been stored into register 206 before the chip emerges from reset, then finite state machine 108 blows a bit (or group of bits) of the counter shown by word 212. This uses up one of the password-guessing opportunities. Once all the bits of word 212 are at state 1, circuit 102 is clamped in the "closed" state. For example, in the case where word 212 is formed of 8 bits (or 32 bits programmed by groups of 4 bits), the circuit is clamped after eight attempts of input of a password via the JTAG interface.

In the case where the data input in the interface correspond (for example, are the same or are linked by a logic combination performed by function 109) to code 204, this means that the entity having the circuit in its possession has the right password to "open" the circuit. If the chip is not clamped into the "closed" state, finite state machine 108 then blows a bit of word 210 and thereby "re-opens" the chip. This "uses up" one of the available circuit-opening opportunities.

The circuit, except the fuse-type non-volatile memory no, may then be submitted to a scan test. An "open" chip can be "closed" at any time by blowing a bit (or group of bits) of counter shown by word 208. This operation can be executed by processor 112 or a debugger attached to the JTAG port 104.

The closing of the circuit involves the blowing of a bit of word 208, thus using up one of the circuit-closing opportunities. If all bits of word 208 are blown, the circuit is clamped to the closed state and can no longer be re-open.

In a simplified embodiment, only counters 208 and 210 are provided. Indeed, counter 212 only prevents a very difficult brute force password-guessing attack. This can be useful if the passwords 204 are short.

Although this is not directly linked to the protection of the content of memory no during the execution of the tests, an advantage induced by the implementation of re-opening(s) by state machine 108 rather than by processor 112 is that re-opening for scan test will work even if there is a manufacturing defect in processor 112 itself. Now, processor 112 occupies a significant surface area of circuit 102, particularly as compared with the bulk of state machine 108, and the probability for the defect having caused the circuit malfunction to be present therein is not negligible.

Figure 3:
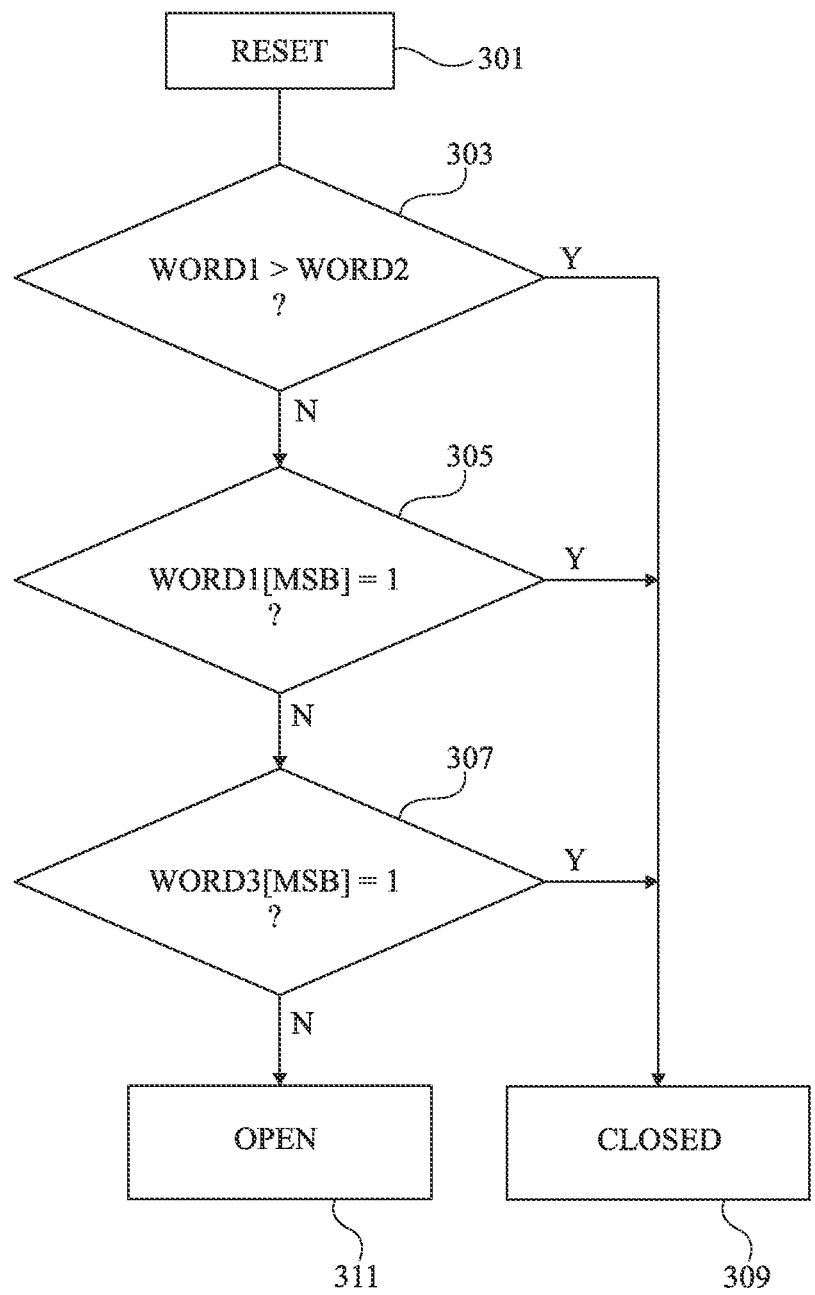
FIG. 3 is a flow chart of an embodiment method for protecting the content of a fuse memory.

FIG. 3 is a decision tree illustrating an implementation mode of a method of protecting the content of a fuse memory.

More particularly, FIG. 3 is a decision tree representing the conditions to which circuit 102 is submitted in the open state, respectively, in the closed state.

At each end of booting or end of resetting (block 301, RESET) of circuit 102, finite state machine 108 verifies the state (open or closed) of circuit 102. The state is determined by the respective values of the first, second, and third words 212, 210, and 208.

Preferably, the verifications of the respective counts represented by words 208, 210, and 212 are performed by determining the rank of the most significant bit which is at state 1. In the example of FIG. 3, it is assumed that all counters are over the same number of bits.

Thus, in the shown example, finite state machine 108 starts by verifying (block 303, WORD 1>WORD 2?), whether the value of first word 208 is greater than the value of second word 210. If so (output Y of block 303), this means that the last operation on words 208, 210, and 212 has been a closing of circuit 102, and the state of circuit 102 thus remains in the closed state (block 309, CLOSED). If not (output N of block 303), in other words, if the value of first word 208 is smaller than or equal to the value of second word 210, finite state machine 108 verifies (block 305, WORD1[MSB]=1?) whether the most significant bit (MSB) of first word 210 is at state 1. If so (output Y of block 305), the maximum number of circuit closings has been reached, and circuit 102 is in the closed state (block 309, CLOSED). Otherwise (output N of block 305), finite state machine 108 optionally verifies (block 306, WORD3[MSB]=1?) whether the most significant bit (MSB) of third word 212 is at state 1. If so (output Y of block 307), this means that the maximum number of attempts to introduce passwords has been reached, and the circuit then remains in closed state 309. Otherwise (output N of block 307), or 305 if step 307 is omitted, the state of circuit 102 is the open state (block 311, OPEN), and the test interface may send, via the shift register, the instructions required to execute scan-test of the circuit.

In other words, for the state of circuit 102 to be open state 311, the most significant bits of words 208 and 212 should have value 0, and the value of second word 210 should be smaller than or equal to the value of first word 208.

The order of steps 303, 305, and 307 of FIG. 3 is of no importance. In practice, these steps may be carried out in parallel or independently from one another by state machine 108 since it is sufficient for a single one of the steps to provide a true result for the circuit to be in the closed state.

Figure 4:
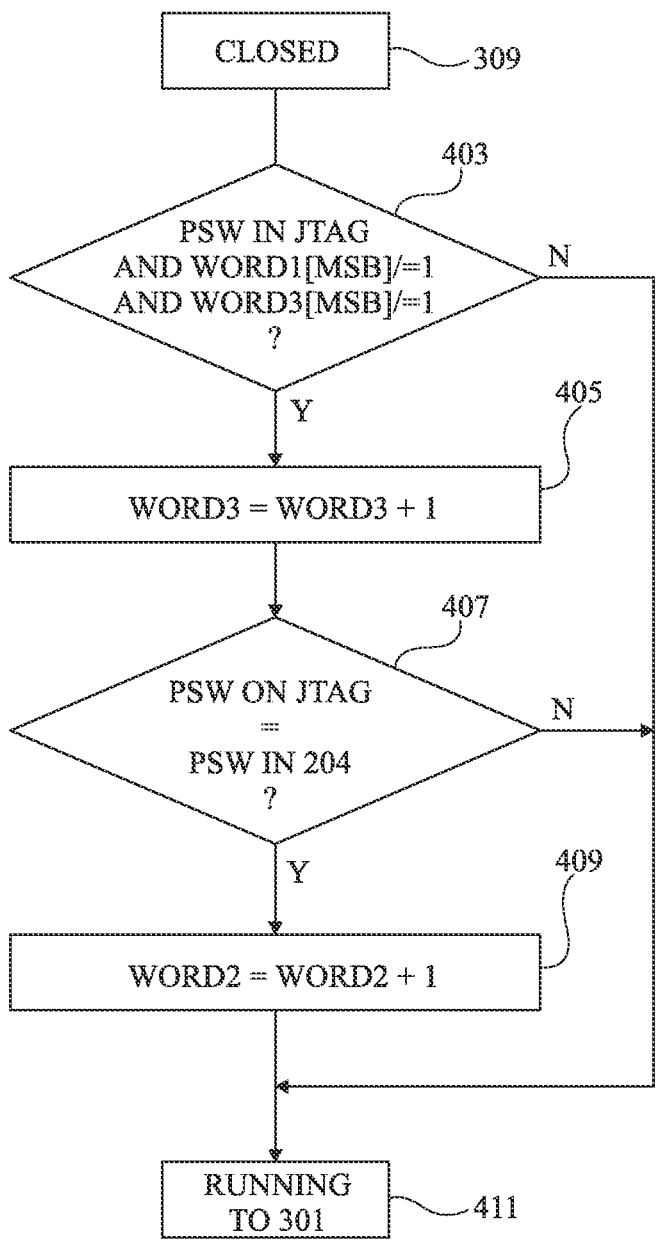
FIG. 4 is a flowchart of an embodiment method for transitioning to a scan-test available mode of an integrated circuit.

FIG. 4 is a flowchart showing steps of an implementation mode of a transition of an integrated circuit to the test mode.

More particularly, FIG. 4 is a flowchart showing operations of an implementation mode of the transition from closed state 309 (FIG. 3) to reset 301.

While the circuit 102 is in reset, if finite state machine indicates, at the end of verifications illustrated by FIG. 3, that the circuit is in a closed state (block 309, CLOSED), finite state machine 108 performs a verification, block 403 (PSW ON JTAG AND WORD1[MSB]/=1 AND WORD3 [MSB]/=1?), of the content of register 206 to verify whether a password has been input via the JTAG interface while the resetting and of the values of the first and second words to check that none of them has its maximum significant bit in state 1 (i.e. blown).

If no password has been input (output N of block 403), the test request verification process stops (block 411, RUNNING TO 301) and the circuit will, once reset in block 301, stay in the closed state.

If a password has been input (output Y of block 403), finite state machine 108 blows, in embodiments where the third word 212 exists, the state of the bit of lowest order being at state 0 of word 212 to state 1. This action increments (block 405, WORD3=WORD3+1) the counter of the number of attempts.

Afterward steps 403, and when step 405 is applicable, internal data 204 are read by wrapper 106. At step 407, wrapper 106 verifies (block 405, PSW ON JTAG=PSW IN 204) the correspondence (for example, equality) between the data present in register 206 and code 204.

If the data of register 206 and code 204 do not match (output N of block 407), the verification process stops (block 411), and the circuit will, preferably by the implementation of the steps of FIG. 3, remain closed.

In the case where the data of register 206 and code 204 match (output Y of block 407), finite state machine 108 blows (block 409, WORD2=WORD2+1) the bit of second word 210 of lowest order being at state 0 to state 1 to open the circuit. Then, the verification process ends (block 411), and the circuit will be found to be open at the next reset 301.

Initially (at the manufacturing output), all the bits of fuse memory no (at least those of area 202 and of words 208, 210, and 212) are preferably at state 0. Accordingly, the circuit is in an open state, which is not disturbing since no "secret" has been introduced into area 202.

The transition from the open mode to the closed state raises no issue relative to the security of the data stored in area 202. This transition may be triggered by processor 112.

An initial transition is preferably triggered before customizing the data meant to remain protected, and codes 204 have been stored in area 202. For example, a program code executed by processor 112 causes the blowing of the least significant bit (LSB) of word 208 (WORD1), which will place the circuit in the closed state at the next reboot.

According to an alternative embodiment, a debugger attached to the circuit could blow the bit of word 208 of lowest order still at state 0 to close the chip.

According to an alternative embodiment, the first switching to the closed state can blows all the bits in word 208 in one go (e.g., set WORD1=7). To re-open the chip, it will then be necessary to enter the password several times, (e.g., 7 times), and the transition to the OPEN state will only be successful on last (e.g., $7^{th}$) entry (when the value of word 210 reaches 7). Doing so, a transition from closed to open can only occur once.

According to another alternative embodiment, the check performed on the maximum significant bit of word 208 (maximum number of closings reached) can be replaced by a check performed on the maximum significant bit of word 210 (maximum number of openings reached).

An advantage of the described embodiments is that only finite state machine 108 can read code 204. The central processor 104 cannot. Thus, the surface area of an attack to extract 204 is reduced. In other words, re-opening can only be done by finite state machine 108, and does not involve the central processor. Thus, the surface area of a fraudulent attack to re-open the chip is reduced.

Another advantage of the described embodiments is that the re-openings are executed by a finite state machine independent from the processor, thus enabling to detect one or a plurality of defects that might be present in the processor.

Another advantage of the described embodiments is that the implementation of the finite state machine requires a simple combinational logic capable of being implemented in a robust fashion.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove. In particular, the sizes of code 204 as well as of words 208, 210, and 212 may vary from one embodiment to another.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A method, comprising:
    verifying, by a finite state machine, values of a first fuse word and values of a second fuse word in a fuse-type non-volatile memory of an integrated circuit, the first fuse word being representative of a number of transitions to a first state of the integrated circuit, the second fuse word being representative of a number of transitions to a second state of the integrated circuit;
    allowing read access to a first area of the fuse-type non-volatile memory by a processor in the first state based on the verifying the values of the first fuse word and the values of the second fuse word; and
    forbidding read access to the fuse-type non-volatile memory by the processor in a second state of the integrated circuit based on the verifying the values of the first fuse word and the values of the second fuse word.

2. The method of claim 1, wherein the verifying comprises comparing the values of the first fuse word against the values of the second fuse word and based on a value of a maximum significant bit of the first fuse word.

3. The method of claim 2, wherein the first state corresponds to a state of the integrated circuit where:
    the value of the second fuse word is less than the value of the first fuse word, or
    the maximum significant bit of the first fuse word is blown.

4. The method of claim 1, wherein the verifying is performed at each reset of the integrated circuit, and wherein a scan test of the integrated circuit is forbidden in the first state.

5. The method of claim 1, wherein a scan test is enabled for the integrated circuit except for the fuse-type non-volatile memory in the second state.

6. The method of claim 1, wherein a transition from the first state to the second state is performed only in response to, emerging from reset, a value, entered into a register from the outside of the integrated circuit where the integrated circuit is in reset, corresponds to a code stored in the first area of the fuse-type non-volatile memory, the code being only readable by the finite state machine.

7. The method of claim 6, wherein each transition of the integrated circuit to the first state is preceded by an incrementation of a first counter defined by the first fuse word, and wherein each transition of the integrated circuit to the second state is preceded by an incrementation of a second counter defined by the second fuse word.

8. The method of claim 7, wherein an incrementation of the second counter is exclusively caused by the finite state machine, and wherein an incrementation of the first counter is accessible to the processor.

9. The method of claim 7, wherein an introduction of value in a register, as the integrated circuit is in the first state while emerging from reset, increments a third counter defined by a third fuse word in fuse-type non-volatile memory, the maximum significant bit of the third fuse word being different than 1.

10. The method of claim 9, wherein, after emerging from the reset, the integrated circuit is in the second state based on:
    a value of the third counter being greater than the value of the second counter;
    a most significant fuse-bit of the first fuse word being in a programmed state; or
    a most significant fuse-bit of the third fuse word being in a programmed state.

11. The method of claim 9, wherein the integrated circuit is in the first state based on:
    a value of the first counter being smaller than or equal to the value of the second counter; and
    a most significant bit of the third fuse word and the first fuse word is in a non-programmed state.

12. An integrated circuit, comprising:
    a fuse-type non-volatile memory;
    a processor; and
    a finite state machine configured to:
        verify values of a first fuse word and values of a second fuse word in the fuse-type non-volatile memory, the first fuse word being representative of a number of transitions to a first state of the integrated circuit, the second fuse word being representative of a number of transitions to a second state of the integrated circuit,
        allow read access to a first area of the fuse-type non-volatile memory by the processor in the first state based on verifying that the values of the first fuse word and the values of the second fuse word, and
        forbid read access to the fuse-type non-volatile memory by the processor in a second state of the integrated circuit based on verifying that the values of the first fuse word and the values of the second fuse word.

13. The integrated circuit of claim 12, wherein the verifying comprises comparing the values of the first fuse word against the values of the second fuse word and based on a value of a maximum significant bit of the first fuse word.

14. The integrated circuit of claim 13, wherein the first state corresponds to a state of the integrated circuit where:
the value of the second fuse word is less than the value of the first fuse word, or
the maximum significant bit of the first fuse word is blown.

15. The integrated circuit of claim 12, wherein the verifying is performed at each reset of the integrated circuit, and wherein a scan test of the integrated circuit is forbidden in the first state.

16. The integrated circuit of claim 12, wherein a scan test is enabled for the integrated circuit except for the fuse-type non-volatile memory in the second state.

17. The integrated circuit of claim 12, wherein a transition from the first state to the second state is performed only in response to, emerging from reset, a value, entered into a register from the outside of the integrated circuit where the integrated circuit is in reset, corresponds to a code stored in the first area of the fuse-type non-volatile memory, the code being only readable by the finite state machine.

18. The integrated circuit of claim 17, wherein each transition of the integrated circuit to the first state is preceded by an incrementation of a first counter defined by the first fuse word, and wherein each transition of the integrated circuit to the second state is preceded by an incrementation of a second counter defined by the second fuse word.

19. The integrated circuit of claim 18, wherein an incrementation of the second counter is exclusively caused by the finite state machine, and wherein an incrementation of the first counter is accessible to the processor.

20. The integrated circuit of claim 19, wherein an introduction of value in a register, as the integrated circuit is in the first state while emerging from reset, increments a third counter defined by a third fuse word in fuse-type non-volatile memory, the maximum significant bit of the third fuse word being different than 1.

21. The integrated circuit of claim 20, wherein, after emerging from the reset, the integrated circuit is in the second state based on:
a value of the third counter being greater than the value of the second counter;
a most significant fuse-bit of the first fuse word being in a programmed state; or
a most significant fuse-bit of the third fuse word being in a programmed state.

22. The integrated circuit of claim 20, wherein the integrated circuit is in the first state based on:
a value of the first counter being smaller than or equal to the value of the second counter; and
a most significant bit of the third fuse word and the first fuse word is in a non-programmed state.

23. A device comprising an integrated circuit, the integrated circuit comprising:
a fuse-type non-volatile memory;
a processor; and
a finite state machine configured to:
verify values of a first fuse word and values of a second fuse word in the fuse-type non-volatile memory, the first fuse word being representative of a number of transitions to a first state of the integrated circuit, the second fuse word being representative of a number of transitions to a second state of the integrated circuit,
allow read access to a first area of the fuse-type non-volatile memory by the processor in the first state based on verifying that the values of the first fuse word and the values of the second fuse word, and
forbid read access to the fuse-type non-volatile memory by the processor in a second state of the integrated circuit based on verifying that the values of the first fuse word and the values of the second fuse word.

24. The device of claim 23, wherein the verifying comprises comparing the values of the first fuse word against the values of the second fuse word and based on a value of a maximum significant bit of the first fuse word.

25. The device of claim 24, wherein the first state corresponds to a state of the integrated circuit where:
the value of the second fuse word is less than the value of the first fuse word, or
the maximum significant bit of the first fuse word is blown.

* * * * *